US009312859B2

(12) United States Patent
Suhonen

(10) Patent No.: US 9,312,859 B2
(45) Date of Patent: Apr. 12, 2016

(54) SWITCHING CIRCUIT AND METHOD

(71) Applicant: ST-Ericsson SA, Plan-les-Ouates (CH)

(72) Inventor: Marcus Suhonen, Paimio (FI)

(73) Assignee: ST-ERICSSON SA, Plan-les-Ouates (CH)

( * ) Notice: Subject to any disclaimer, the term of this patent is extended or adjusted under 35 U.S.C. 154(b) by 18 days.

(21) Appl. No.: 14/361,833

(22) PCT Filed: Jan. 25, 2013

(86) PCT No.: PCT/EP2013/051459
§ 371 (c)(1),
(2) Date: May 30, 2014

(87) PCT Pub. No.: WO2013/110771
PCT Pub. Date: Aug. 1, 2013

(65) Prior Publication Data
US 2014/0370943 A1 Dec. 18, 2014

Related U.S. Application Data

(60) Provisional application No. 61/594,022, filed on Feb. 2, 2012.

(30) Foreign Application Priority Data

Jan. 27, 2012 (EP) ...................... 12152975

(51) Int. Cl.
*H01Q 11/12* (2006.01)
*H03K 19/0185* (2006.01)
(Continued)

(52) U.S. Cl.
CPC ........ *H03K 19/018571* (2013.01); *H03B 28/00* (2013.01); *H03K 19/0013* (2013.01);
(Continued)

(58) Field of Classification Search
CPC ................. H01L 2924/00; H01L 2924/13091; H01L 21/761; H01L 27/0922; H01L 2924/00014; H01L 2924/1305; H01L 2924/1306; H01L 29/7816; H01L 27/105; H01L 27/11803; H01L 27/1203; H02M 2001/0048; H02M 3/3376; H02M 2001/007; H02M 3/156; H02M 2001/0012; H02M 3/157; H02M 2007/4815; H02M 7/1557; H02M 7/53871; H03K 17/063; H03K 17/6871; H03K 17/04123; H03K 2017/066
USPC .......... 326/38, 41, 98, 101, 30; 257/E21.438, 257/337, 338, E21.644, 334, 335, E21.544, 257/E21.639, E27.06; 455/33, 550.1, 574, 455/556.1, 118, 127.3, 127.4, 150.1, 287, 455/41.1, 84, 85, 88, 125, 127.1, 136; 323/282, 284, 285, 224, 283; 327/108, 327/114, 165, 172, 179, 223, 194, 199, 327/204; 363/21.06, 21.12, 21.14, 89, 98, 363/21.15, 21.18, 26, 41, 60, 65, 79, 81, 87
See application file for complete search history.

(56) References Cited

U.S. PATENT DOCUMENTS 7,904,036 B2 * 3/2011 Mattisson ............... H03C 3/40
330/10
2004/0246055 A1 * 12/2004 Hardial .................... H01P 5/12
330/295
2005/0168243 A1 8/2005 Takahashi et al.

FOREIGN PATENT DOCUMENTS

EP 0 072 686 A2 2/1983
EP 0 251 910 A2 1/1988

OTHER PUBLICATIONS

Microelectronic Circuits Fourth Edition, by Sedra/Smith, ISBN 0195116631, 1998.*

(Continued)

Primary Examiner — Fred Casca
(74) Attorney, Agent, or Firm — Patent Portfolio Builders PLLC

(57) ABSTRACT

A switching circuit that switches voltage at an output node includes a first switch element configured to enable supplying a first voltage from a first supply node to the output node, a second switch element configured to enable supplying a second voltage from a second supply node to the output node, and a controller. The controller switches the first and the second switch element between a first state and a second state depending on an input voltage. In the first state, the first switch element is in a conducting state and the second switch element is in a non-conducting state, and, in the second state the first switch element is in a non-conducting state and the second switch element is in a conducting state, the switching being performed through an intermediate state in which both the first and the second switch element are in the non-conducting state.

8 Claims, 7 Drawing Sheets

(51) Int. Cl.
  *H03K 19/00* (2006.01)
  *H03K 19/003* (2006.01)
  *H03B 28/00* (2006.01)
  *H04W 52/02* (2009.01)
  *H01L 21/761* (2006.01)
  *H02M 1/00* (2007.01)
  *H02M 3/156* (2006.01)
  *H02M 3/337* (2006.01)
  *H02M 7/48* (2007.01)

(52) U.S. Cl.
  CPC ....... *H03K19/00361* (2013.01); *H04W 52/028* (2013.01); *H01L 21/761* (2013.01); *H01L 2924/00* (2013.01); *H01L 2924/13091* (2013.01); *H02M 3/156* (2013.01); *H02M 3/3376* (2013.01); *H02M 2001/0048* (2013.01); *H02M 2007/4815* (2013.01)

(56) References Cited

OTHER PUBLICATIONS

International Search Report issued in corresponding International application No. PCT/EP2013/051459, date of mailing Feb. 21, 2013.
Written Opinion of the International Searching Authority issued in corresponding International application No. PCT/EP2013/051459, date of mailing Feb. 21, 2013.
European Search Report issued in corresponding European application No. 12 15 2975.4, dated Jul. 5, 2012.
Extended European Search Report in corresponding European Patent Application No. 12152975.4 dated Jul. 5, 2012.
Response dated Jan. 23, 2014 to Extended European Search Report in corresponding European Patent Application No. 12152975.4 dated Jul. 5, 2012.
European Office Action in corresponding European Application No. 12 152 975.4 dated Jan. 26, 2015.
Response dated Aug. 4, 2015 to European Office Action in corresponding European Application No. 12 152 975.4 dated Jan. 26, 2015.

* cited by examiner

SWITCHING CIRCUIT AND METHOD

This application is a 371 National Stage of PCT/EP2013/051459, filed Jan. 25, 2013, which claims the benefit of U.S. Provisional Application 61/594,022, filed Feb. 2, 2012, and European Application 12152975.4, filed Jan. 27, 2012.

FIELD OF THE DISCLOSURE

The present disclosure relates to a switching circuit, an integrated circuit comprising the switching circuit, a local oscillator circuit comprising the switching circuit, a wireless communication device comprising the local oscillator circuit, a method of operating a switching circuit.

BACKGROUND TO THE DISCLOSURE

Digital circuitry having a low power consumption can be provided by employing complementary pairs of transistors. Such a complementary pair of transistors is illustrated in FIG. 1. A p-type metal oxide silicon (PMOS) transistor 10 has a source coupled to first a voltage rail having a voltage $V_{DD}$ and a drain coupled to an output node 20. An n-type metal oxide silicon (NMOS) transistor 30 has a source coupled to the output node 20 and a drain coupled to a second a voltage rail having a voltage $V_{SS}$, where $V_{SS}$ is less than $V_{DD}$. A gate of each of the first and second transistors 10, 30 is coupled to an input node 40. The complementary pair of transistors can have either of two states, depending on an input voltage applied to the input node 40. When the input voltage is close to $V_{DD}$, the PMOS transistor 10 is in a non-conducting state and the NMOS transistor 30 is in a conducting state. Consequently, the voltage between the source and drain of the NMOS transistor is small, and the output node 20 is at substantially the voltage $V_{SS}$. Current cannot flow through either the PMOS or NMOS transistor 10, 30 because the PMOS transistor is in the non-conducting state. Conversely, when the input voltage is close to $V_{SS}$, the NMOS transistor 30 is in a non-conducting state and the PMOS transistor 10 is in a conducting state. Consequently, the voltage between the source and drain of the PMOS transistor is small, and the output node 20 is at substantially the voltage $V_{DD}$. Likewise, current cannot flow through either the PMOS or NMOS transistor 10, 30 because the NMOS transistor is in the non-conducting state. Therefore, the complementary pair of transistors operates as an inverter, converting a relatively low input voltage to a relatively high output voltage, and a relatively high input voltage to a relatively low output voltage, and has a very low power consumption. Low power consumption is of particular importance in relation to battery powered devices, especially for devices that are required to operate at a high frequency, such a wireless communication devices.

There is a requirement for improved low power circuitry.

SUMMARY OF THE PREFERRED EMBODIMENTS

According to a first aspect, there is provided a switching circuit for switching a voltage at an output node, comprising:
a first switch element coupled between a first supply node and the output node, the first supply node being at a first supply voltage;
a second switch element coupled between a second supply node and the output node, the second supply node being at a second supply voltage;
a controller arranged to, dependent on an input signal, switch the switching circuit between a first state, in which the first switch element is in a conducting state and the second switch element is in a non-conducting state, and a second state, in which the first switch element is in a non-conducting state and the second switch element is in a conducting state, through an intermediate state in which both the first switch element and the second switch element are in the non-conducting state.

According to a second aspect there is provided a method of operating a switching circuit having a first switch element coupled between a first supply node and an output node, the first supply node being at a first supply voltage, and a second switch element coupled between a second supply node and the output node, the second supply node being at a second supply voltage, the method comprising:
dependent on an input signal, switching the switching circuit between a first state in which the first switch element is in a conducting state and the second switch element is in a non-conducting state, and a second state in which the first switch element is in a non-conducting state and the second switch element is in a conducting state, through an intermediate state in which both the first switch element and the second switch element are in the non-conducting state.

By providing a first switch element coupled between a first supply node, at a first supply voltage, and an output node, and a second switch element coupled between a second supply node, at a second supply voltage, and the output node and, when switching one of the first and second switch elements on and the other of the first and second switch elements off, providing an intermediate period during which both the first and second switch elements are off, that is, in a non-conducting state, flow of current during switching can be reduced or eliminated, thereby reducing power consumption. Moreover, the speed of switching can be increased because the whole of any current flowing in the transition period can serve to charge any parasitic capacitance, thereby increasing the rate of charge of the parasitic capacitance and reducing noise.

In particular, although power consumption can be very low in a complementary pair of transistors when either one of the transistors is in a non-conducting state, there can be a transition period when one of the transistors of a complementary pair is changing from a conducting state to a non-conducting state, and simultaneously the other of the transistors of the complementary pair is changing from a non-conducting state to a conducting state, and during the transition period both of the transistors may temporarily be in a conducting state, enabling current to flow though both transistors, and therefore enabling power to be consumed. Power consumption may be reduced or eliminated by providing an intermediate period during which both the complementary transistors are off, that is, in a non-conducting state.

Thus, the first switch element may comprise a first transistor and the second switch element may comprise a second transistor. This provides a simple configuration requiring a low chip area in an integrated circuit.

The first transistor may be a first p-type metal oxide silicon, PMOS, transistor, the second transistor may be a second n-type metal oxide silicon, NMOS, transistor and the first supply voltage may exceed the second supply voltage. This enables partial re-use of existing designs as the basis for the switching circuit.

The first switch element may comprise a complementary NMOS transistor coupled in series with the second NMOS transistor between the second NMOS transistor and the output node, and wherein a gate of the first PMOS transistor and a gate of the complementary NMOS transistor are coupled together. This also enables partial re-use of existing designs as the basis for the switching circuit, as in this case the combination of the first PMOS transistor and the complementary NMOS transistor are arranged as a complementary pair.

The controller may comprise a divider arranged for dividing the input signal, and the controller may be arranged to apply the input signal to a/the gate of the first PMOS transistor and the divided input signal to a gate of the second NMOS transistor. More generally, the controller may comprise a divider arranged for dividing the input signal, and the controller may be arranged to switch the first switch element between the conducting and non-conducting states in response to the input signal and to switch the second switch element between the conducting and non-conducting states in response the divided input signal. This enables the output signal to be provided with a desired duty cycle and/or time delay.

The controller may be arranged to switch the switching circuit from the first state to the second state through a third state in which the first switch element and the second switch element are in the conducting state, and is arranged to switch the switching circuit from the second state to the first state through the intermediate state. This feature may provide switching through the intermediate state only when the switching circuit is switched from the second state to the first state, and may be used for reducing power consumption, in particular in embodiments comprising the complementary NMOS transistor, which can inhibit the flow of current between the first and second supply nodes when the switching circuit is in the third state. Moreover, in embodiments comprising the divider, this feature enables the output signal to be provided having a noise performance dependent on the noise performance of the input signal, and independent of the noise performance of the divider, thereby enabling the divider to be implemented with a low current and low power consumption.

The switching circuit may implemented in an integrated circuit. Therefore, there is also provided an integrated circuit comprising the switching circuit.

The switching circuit is particularly suited to use in a local oscillator circuit for a wireless communication device. Therefore, there is provided a local oscillator circuit for a wireless communication device, comprising the switching circuit. Furthermore, there is provided a wireless communication device comprising a local oscillator circuit.

There is also provided a divider comprising:

a division element for dividing an input signal to provide a divided input signal;

a first switch element coupled between a first supply node and an output node, the first supply node being at a first supply voltage; and a second switch element coupled between a second supply node and the output node, the second supply node being at a second supply voltage;

wherein the divider is arranged to switch between a first state, in which the first switch element is in a conducting state and the second switch element is in a non-conducting state, and a second state, in which the first switch element is in a non-conducting state and the second switch element is in a conducting state, through an intermediate state in which both the first switch element and the second switch element are in the non-conducting state by controlling the first switch element in response to the input signal and controlling the second switch element in response to the divided input signal.

BRIEF DESCRIPTION OF THE DRAWINGS

Preferred embodiments will now be described, by way of example only, with reference to the accompanying drawings, in which.

DETAILED DESCRIPTION OF PREFERRED EMBODIMENTS

Figure 1:
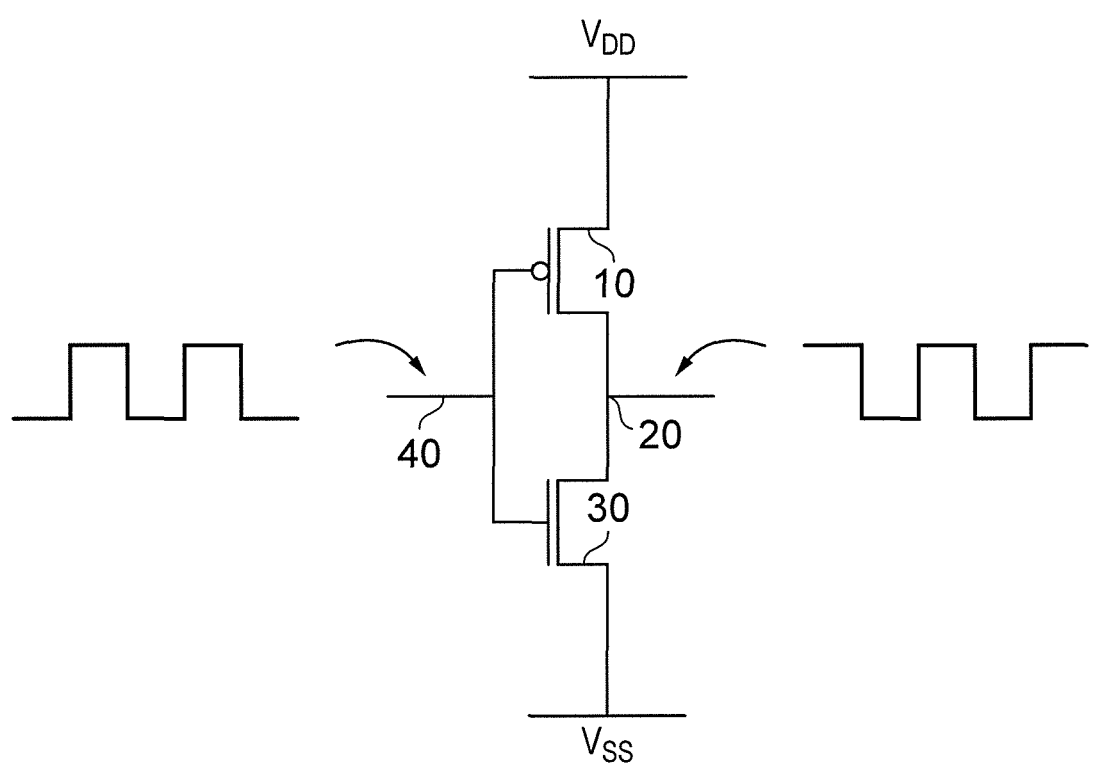
FIG. 1 illustrates a complementary pair of transistors.
Figure 2:
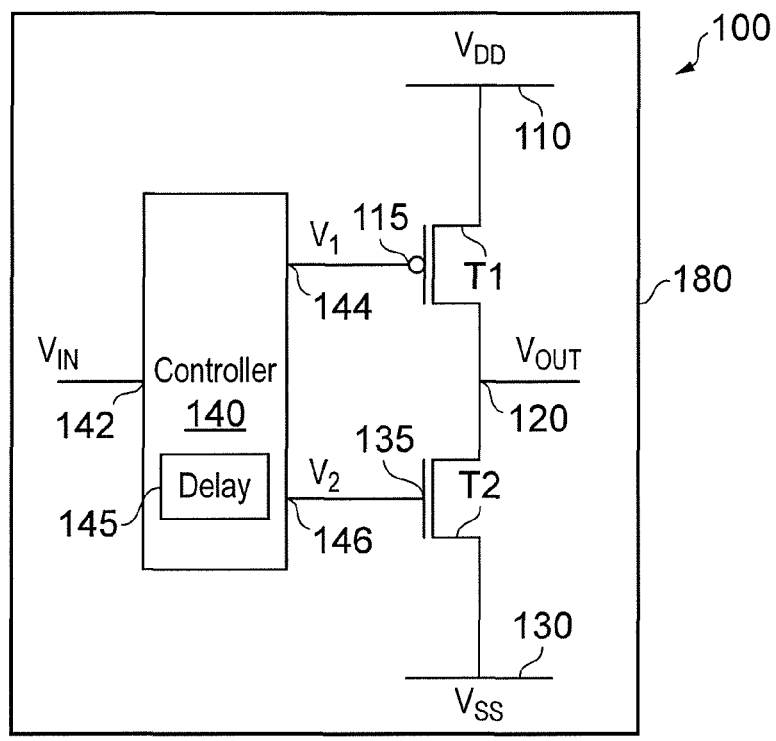
FIG. 2 illustrates a first embodiment of a switching circuit.

Referring to FIG. 2, a switching circuit 100, which may be implemented in an integrated circuit 180, comprises a first PMOS transistor T1 having a source coupled to a first voltage rail 110, also referred to as a first supply node, at a voltage $V_{DD}$ and a drain coupled to an output node 120. A second NMOS transistor T2 has a drain coupled to the output node 120 and a source coupled to a second voltage rail 130, also referred to as a second supply node, at a voltage $V_{SS}$, which is lower than the voltage $V_{DD}$. A controller 140 has an input 142 for an input signal $V_{IN}$, which for the purpose of illustration is periodic, although this is not essential. The controller 140 generates a first control signal $V_1$ at a first output 144 of the controller 140, which is coupled to a gate 115 of the first PMOS transistor T1, and generates a second control signal $V_2$ at a second output 146 of the controller 140, which is coupled to a gate 135 of the second NMOS transistor T2. Transitions in the first and second control signals $V_1$, $V_2$ are arranged to occur at different times, unlike the prior art complimentary pair of FIG. 1 where both transistors are always switched simultaneously.

Figure 3:
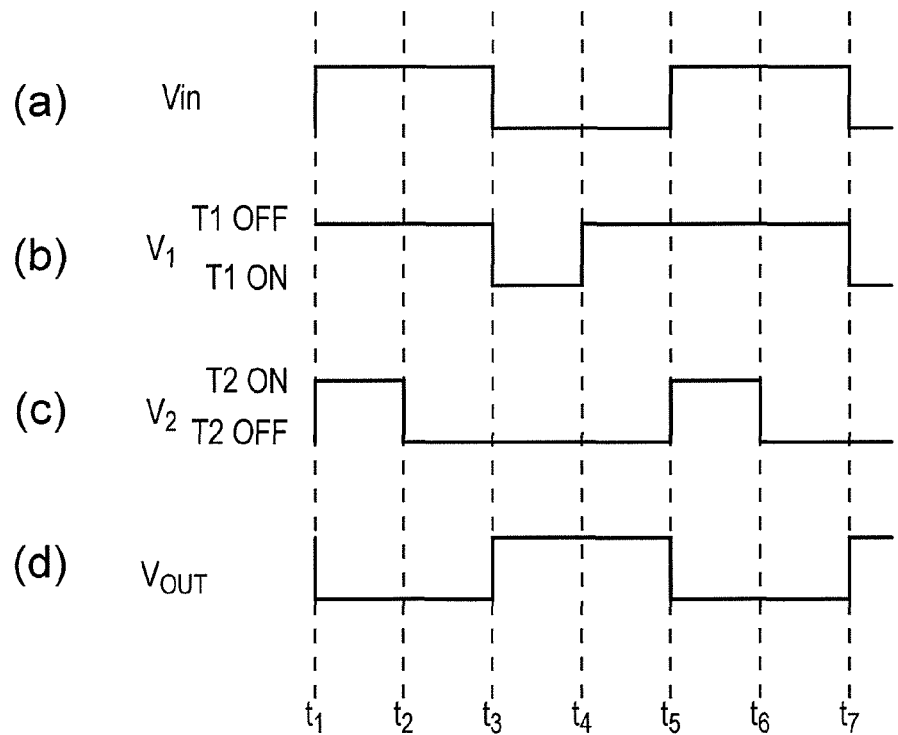
FIG. 3 illustrates signal waveforms relating to the first embodiment of a switching circuit.

Referring to FIG. 3, the input signal $V_{IN}$, shown at waveform a), has a relatively high voltage level during time periods $t_1$ to $t_3$, and $t_5$ to $t_7$, and a relatively low voltage level during the time period $t_3$ to $t_5$, and commencing at time $t_7$. The controller 140 generates the first control signal $V_1$, shown at waveform b), by generating a negative-going pulse in response to each falling edge of the input signal $V_{IN}$, at times $t_3$ and $t_7$, and generates the second control signal $V_2$, shown at waveform c), by generating a positive-going pulse in response to each rising edge of the input signal $V_{IN}$, at times $t_1$ and $t_5$. These negative-going pulses of $V_1$, and positive-going pulses of $V_2$ are illustrated in FIG. 3, each having a duration equal to a quarter of the period of the input signal $V_{IN}$, although the duration may be longer or shorter. The controller 140 comprises a delay element 145, for controlling the duration of each of the pulses of $V_1$, and $V_2$, with the trailing edge of each of the negative-going pulses of $V_1$ and positive-going pulses of $V_2$ triggered by the delay element. The waveforms in FIG. 3 are illustrated with instantaneous transitions, but in practice can have finite rise and fall times, particularly in high frequency application, such as in wireless communication devices.

During the period $t_1$ to $t_2$, when the input signal $V_{IN}$ is at a high level, the first control signal $V_1$ is high, and therefore the first PMOS transistor T1 remains switched off, that is, in a non-conducting state, and the second control signal $V_2$ is at a high level, and therefore the second NMOS transistor T2 is switched on, that is, in a conducting state. The state, on or off, of the first PMOS transistor T1 is indicated against waveform b) in FIG. 3, and the state of the second NMOS transistor T2 is indicated against waveform c) in FIG. 3. Due to the states of the first PMOS transistor T1 and the second NMOS transistor T2, an output signal $V_{OUT}$, shown at waveform d), at the output node 120 has the relatively low voltage $V_{SS}$. At time $t_2$, the positive-going pulse of the second control signal $V_2$ has a falling edge, and consequently the second NMOS transistor T2 switches off, taking the non-conducting state. During the period $t_2$ to $t_3$, both the first PMOS transistor T1 and the second NMOS transistor T2 are switched off, so the output node 120 is floating, or in other words is in a high impedance state, and retains the low voltage $V_{SS}$ of the preceding period $t_1$ to $t_2$. During the switching off of the second NMOS transistor T2 at time $t_2$, no current can flow from the first voltage rail to the second voltage rail because the first PMOS transistor T1 is switched off.

At time $t_3$, the input signal $V_{IN}$, and the first control signal $V_1$ change to the low level, and consequently the first PMOS transistor T1 switches on, which results in the output signal $V_{OUT}$ rising to the relatively high level $V_{DD}$. However, at time $t_3$, no current can flow from the first voltage rail 110 to the second voltage rail 130 because the second NMOS transistor T2 is switched off. In this way, the transition in the output signal $V_{OUT}$ is preceded by a period in which both the first PMOS transistor T1 and the second NMOS transistor T2 are switched off. During the period $t_3$ to $t_4$, the input signal $V_{IN}$, and the first control signal $V_1$ remain at the low level, the first PMOS transistor T1 remains on, the second NMOS transistor remains off, and consequently the output signal $V_{OUT}$ remains at the high level $V_{DD}$.

At time $t_4$, the negative-going pulse of the first control signal $V_1$ has a rising edge, and consequently the first PMOS transistor T1 switches off, taking the non-conducting state. During the period $t_4$ to $t_5$, both the first PMOS transistor T1 and the second NMOS transistor T2 are switched off, so the output node 120 is floating and retains the high voltage $V_{DD}$ of the preceding period $t_3$ to $t_4$. During the switching off of the first PMOS transistor T1 at time $t_4$, no current can flow from the first voltage rail 110 to the second voltage rail 130 because the second NMOS transistor T2 is switched off.

At time $t_5$, the input signal $V_{IN}$, and the second control signal $V_2$ change to the high level, and consequently the second NMOS transistor T2 switches on, which results in the output signal $V_{OUT}$ falling to the low level $V_{SS}$. However, at time $t_5$, no current can flow from the first voltage rail to the second voltage rail because the first PMOS transistor T1 is switched off. Again, the transition in the output signal $V_{OUT}$ is preceded by a period in which both the first PMOS transistor T1 and the second NMOS transistor T2 are switched off. As the input signal $V_{IN}$ is periodic, the waveforms from time $t_5$ onwards replicate the waveforms from time $t_1$. The output signal $V_{OUT}$ is an inverted version of the input signal $V_{IN}$, and therefore the switching circuit 100 operates as an inverter. Therefore, the embodiment illustrated in FIG. 2 is suitable for use in applications where the output signal $V_{OUT}$ is required to be equal to the input signal $V_{IN}$ inverted.

The switching circuit enables power conservation by preventing current from flowing from the first voltage rail to the second voltage rail during transitions in the output signal $V_{OUT}$. Current may flow to or from any parasitic capacitance that is present between the output node 120 and the first and second voltage rails, but nevertheless a valuable power saving can be achieved.

Figure 4:
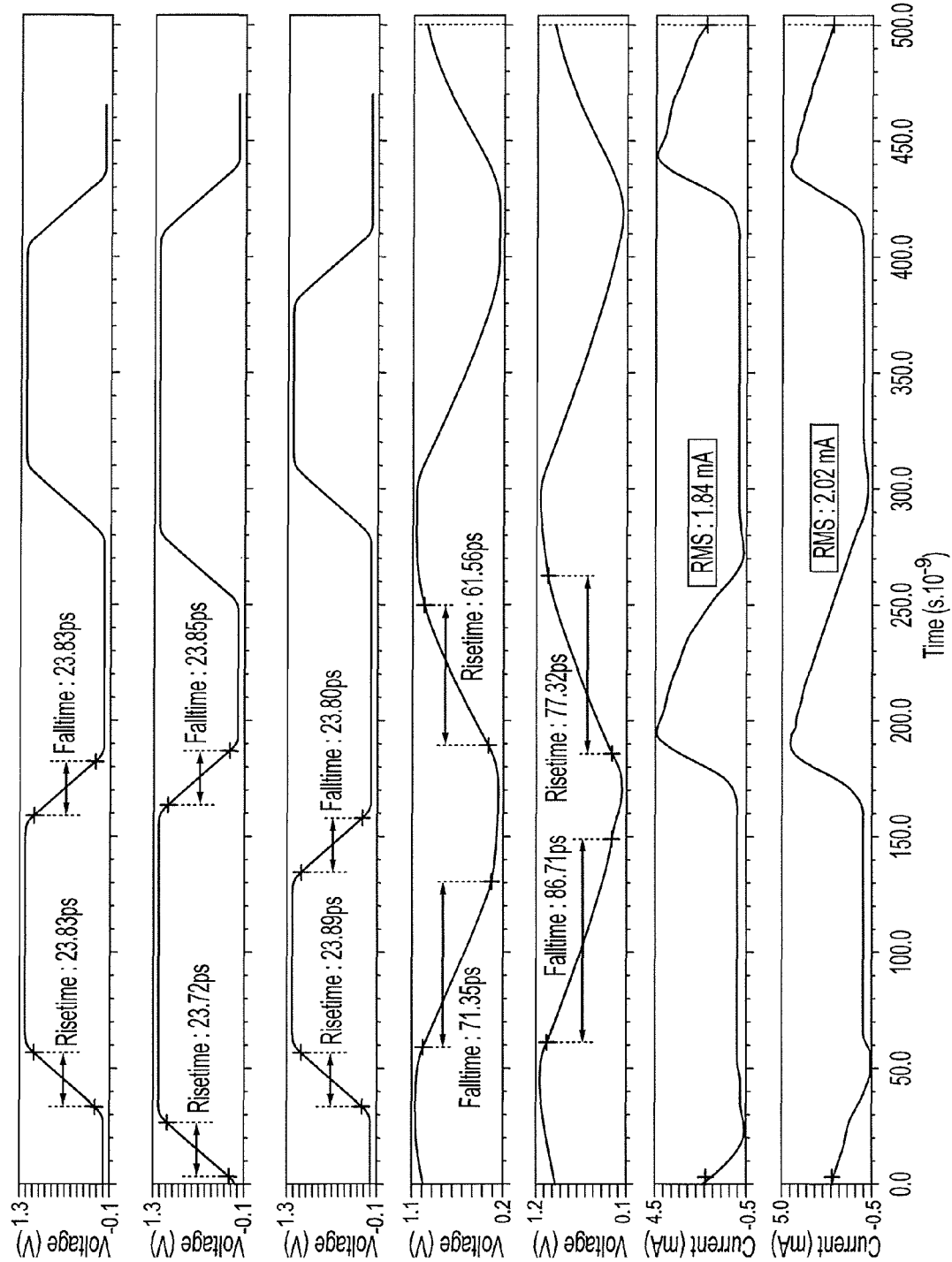
FIGS. 4A to 4G illustrate signal waveforms with parasitic effects included.

FIGS. 4A to 4G illustrate signal waveforms based on simulation of the switching circuit 100 with a parasitic capacitance of 300 fF between the output node 120 and the second voltage rail 130, and consequently with finite rise and fall times. FIG. 4A illustrates the input signal $V_{IN}$ having a frequency of 4 GHz and a 50% duty cycle, for which the rise time and fall time is about 24 μs. FIGS. 4B and 4C illustrate, respectively, the first and second control signals $V_1$, $V_2$, which also have a rise and fall time of about 24 ps. FIG. 4D illustrates the output signal $V_{OUT}$ at the output node 120, and in this case the rise time is about 61 ps and the fall time is about 71 ps. The rise and fall times are slower, relative to the rise and fall times of the input signal $V_{IN}$, due to the effect of the parasitic capacitance, and the fall time is longer than the rise time because the falling edge occurs when the second NMOS transistor T2 switches on, and the rising edge occurs when the first PMOS transistor T1 switches on, and the on-resistance of the second NMOS transistor T2 higher than the on-resistance of the first PMOS transistor T1. The on-resistance of the first PMOS transistor T1 and of the second NMOS transistor T2 may be controlled during manufacture by selecting the width of the respective transistors. For comparison, FIG. 4E illustrates the corresponding signal at the output node 120 of the prior art complementary pair of FIG. 1 when supplied with the same input signal illustrated in FIG. 4A. In this case, the rise and fall time is longer due to the current flowing from the first voltage rail 110 to the second voltage rail 130 during the rise and fall, the rise time being about 77 ps and the fall time being about 87 ps, and the power consumption is greater. FIG. 4F illustrates the current flowing into the second voltage rail 130 during the rise and fall periods for switching circuit 100 described with reference to FIG. 2, and FIG. 4G illustrates the current flowing into the second voltage rail 130 during the rise and fall periods for the prior art arrangement of FIG. 1, from which it can be seen that the current is larger in the latter case, being 2.0 mA compared with 1.8 mA for FIG. 4F, and flows for longer than in the case of FIG. 4F.

Figure 5:
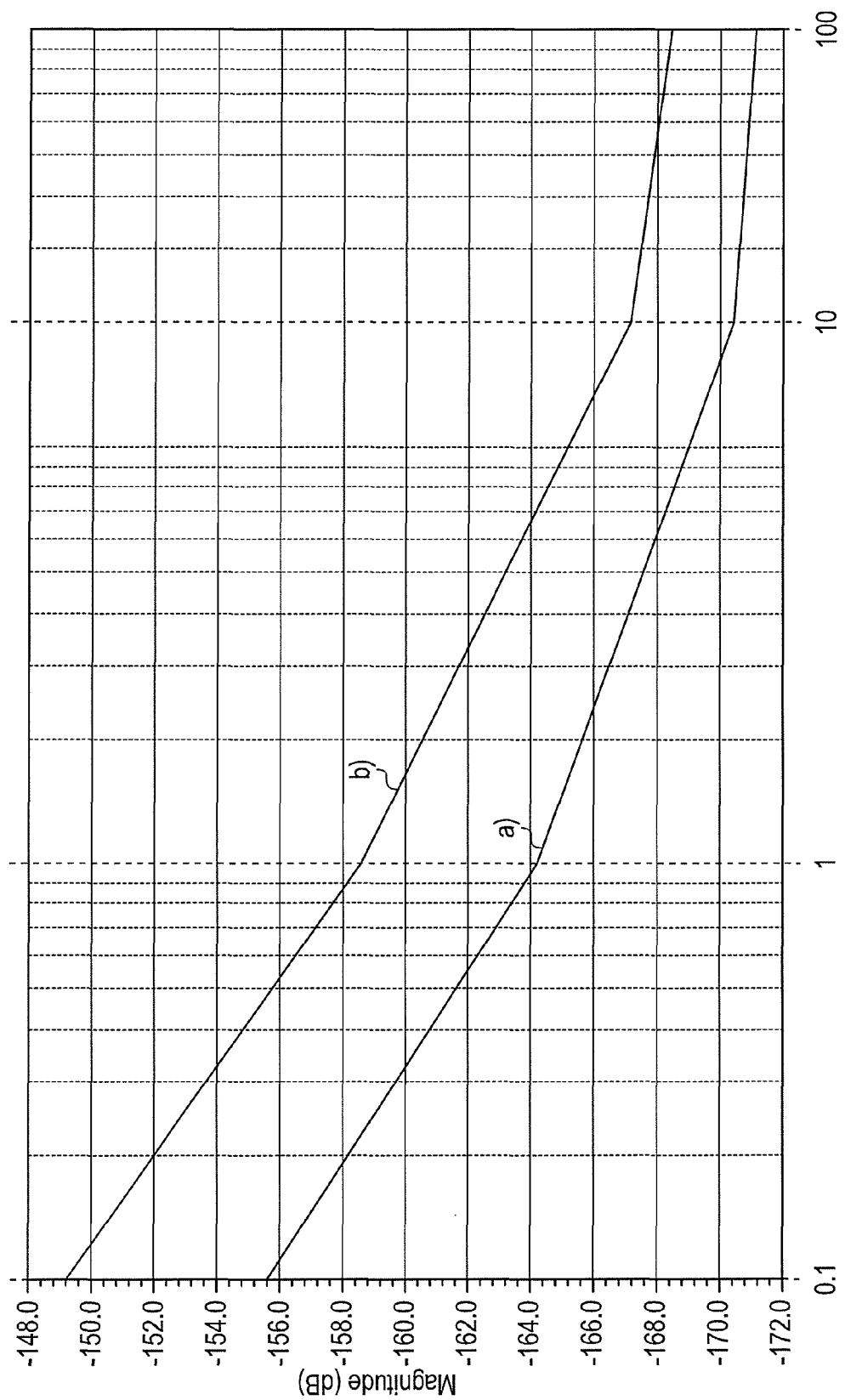
FIG. 5 illustrates phase noise.

The faster rise and fall times provided by the switching circuit 100 of FIG. 2, in comparison with the prior art switching circuit of FIG. 1, enables reduced noise in the output signal $V_{OUT}$, due to reduced jitter in the time of transitions in the output signal $V_{OUT}$. This is demonstrated by the noise, or more specifically phase noise, of the output signal $V_{OUT}$, illustrated in FIG. 5, graph a) for the switching circuit 100 of FIG. 2, and in graph b) for the prior art switching circuit of FIG. 1, for the same simulation conditions employed for the waveforms of FIGS. 4A to 4G. The level of noise in graph a) is in the range 2.5 dB to 6 dB lower than level of noise in graph b), decreasing with increasing frequency from the frequency of the input signal $V_{IN}$. For example, at a frequency of 1 MHz from the frequency of the input signal $V_{IN}$, that is, at 4.001 GHz, the level of noise in graph a) is 6 dB lower than the level of noise in graph b), indicating a 6 dB reduction in noise for the switching circuit 100 of FIG. 2, and at 100 MHz from the frequency of the input signal $V_{IN}$, that is, at 4.100 GHz, there is a reduction in noise of about 2.5 dB.

Figure 6:
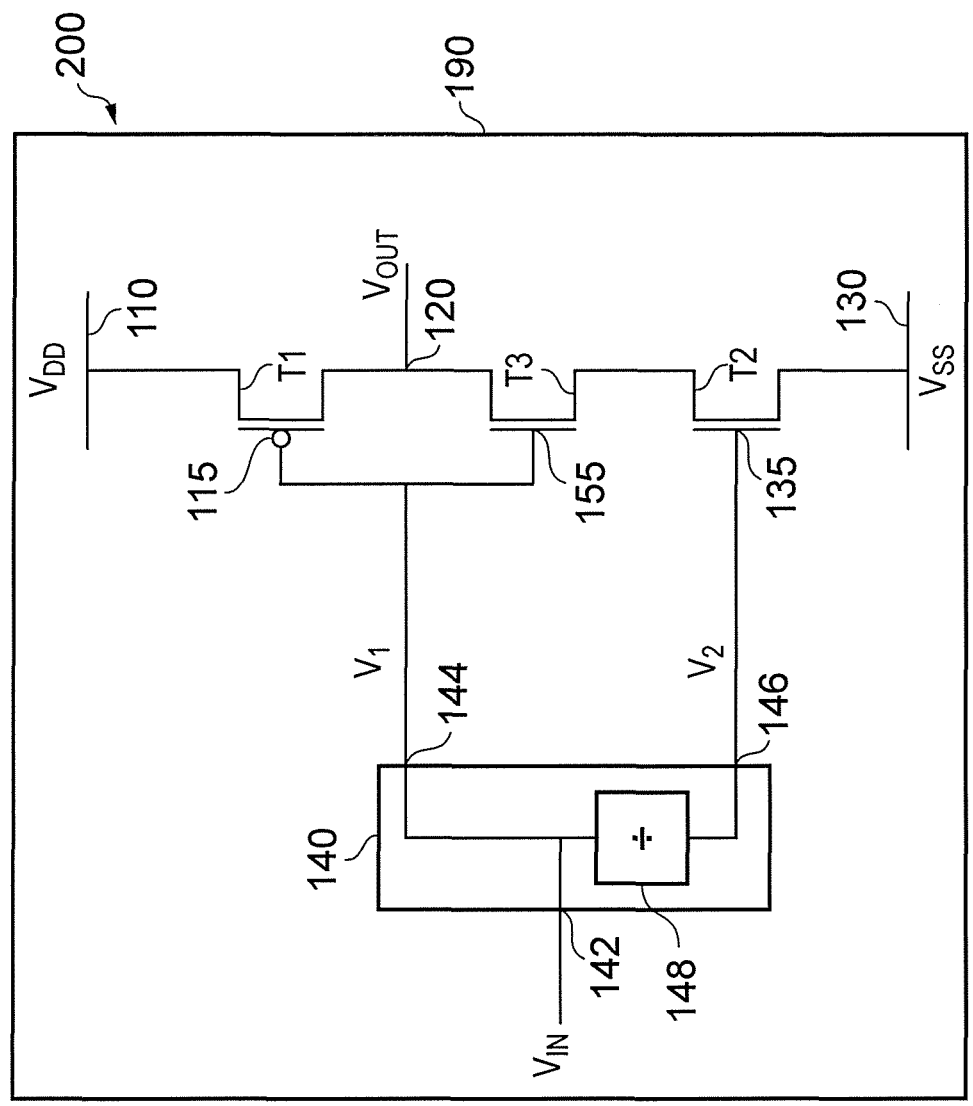
FIG. 6 illustrates a second embodiment of a switching circuit.

Referring to FIG. 6, a second embodiment of a switching circuit 200, which may be implemented in an integrated circuit 190, comprises the first PMOS transistor T1 having its source coupled to the first voltage rail 110 at a voltage $V_{DD}$ and its drain coupled to the output node 120. The second NMOS transistor T2 has its drain coupled to the output node 120 by means of a complementary NMOS transistor T3 which has a source coupled to the drain of the second NMOS transistor T2 and a drain coupled to the output node 120. The source of the second NMOS transistor T2 is coupled to the second voltage rail 130 at the voltage $V_{SS}$, which is lower than the voltage $V_{DD}$. The controller 140 has the input 142 for the input signal $V_{IN}$, which for the purpose of illustration is periodic, although this is not essential. The controller 140 generates the first control signal $V_1$ at the first output 144, which is coupled to the gate 115 of the first PMOS transistor T1, and generates the second control signal $V_2$ at the second output 146, which is coupled to the gate 135 of the second NMOS transistor T2. A gate of the complementary NMOS transistor T3 is coupled to the gate of the first PMOS transistor T1 for receiving the first control signal $V_1$.

The controller 140 described above in relation to the embodiment of FIG. 2 may be used in the embodiment of FIG. 6, operating in the same way described above with reference to FIG. 3, thereby generating the first and second control signals $V_1$, $V_2$ illustrated in FIG. 3. The additional complementary NMOS transistor T3 present in the embodiment of FIG. 6 does not change the switching of the first PMOS transistor T1 and the second NMOS transistor T2 described above with reference to FIG. 3 because the complementary NMOS transistor T3 is switched on at least whenever the second NMOS transistor T2 is switched on, and is only switched off when the second NMOS transistor T2 is switched off. Therefore, by using the controller 140 described above in relation to the embodiment of FIG. 2, the switching circuit 200 of FIG. 6 operates as an inverter and is suitable for use in applications where the output signal $V_{OUT}$ at the output node 120 is required to be equal to the input signal $V_{IN}$ inverted.

An alternative embodiment of the controller 140 is illustrated in FIG. 6, and generates the first and second control signals $V_1$, $V_2$ having different waveforms than those illustrated in FIG. 3. Again, transitions in the first and second control signals $V_1$, $V_2$ can occur at different times, unlike the prior art complimentary pair of FIG. 1 where both transistors are always switched simultaneously. Referring to FIG. 6, the input 142 of the controller 140 is coupled directly to the first output 144 of the controller 140, so the first control signal $V_1$ is equal to the input signal $V_{IN}$. The input 142 of the controller 142 is coupled to the second output 146 of the controller 140 by means of a division stage 148, so the second control signal $V_2$ is equal to the divided input signal $V_{IN}$. The switching circuit 200 of FIG. 6 is suitable for use in applications where the output signal $V_{OUT}$ is required to be equal to the input signal $V_{IN}$ inverted and divided. Therefore, the configuration of the first PMOS transistor T1, second NMOS transistor and the complementary transistor T3 is suitable for use as, for example, an output buffer of a division circuit. The division stage 148 can have a division ratio that is dependent on the application of the switching circuit 200 of FIG. 6.

Figure 7:
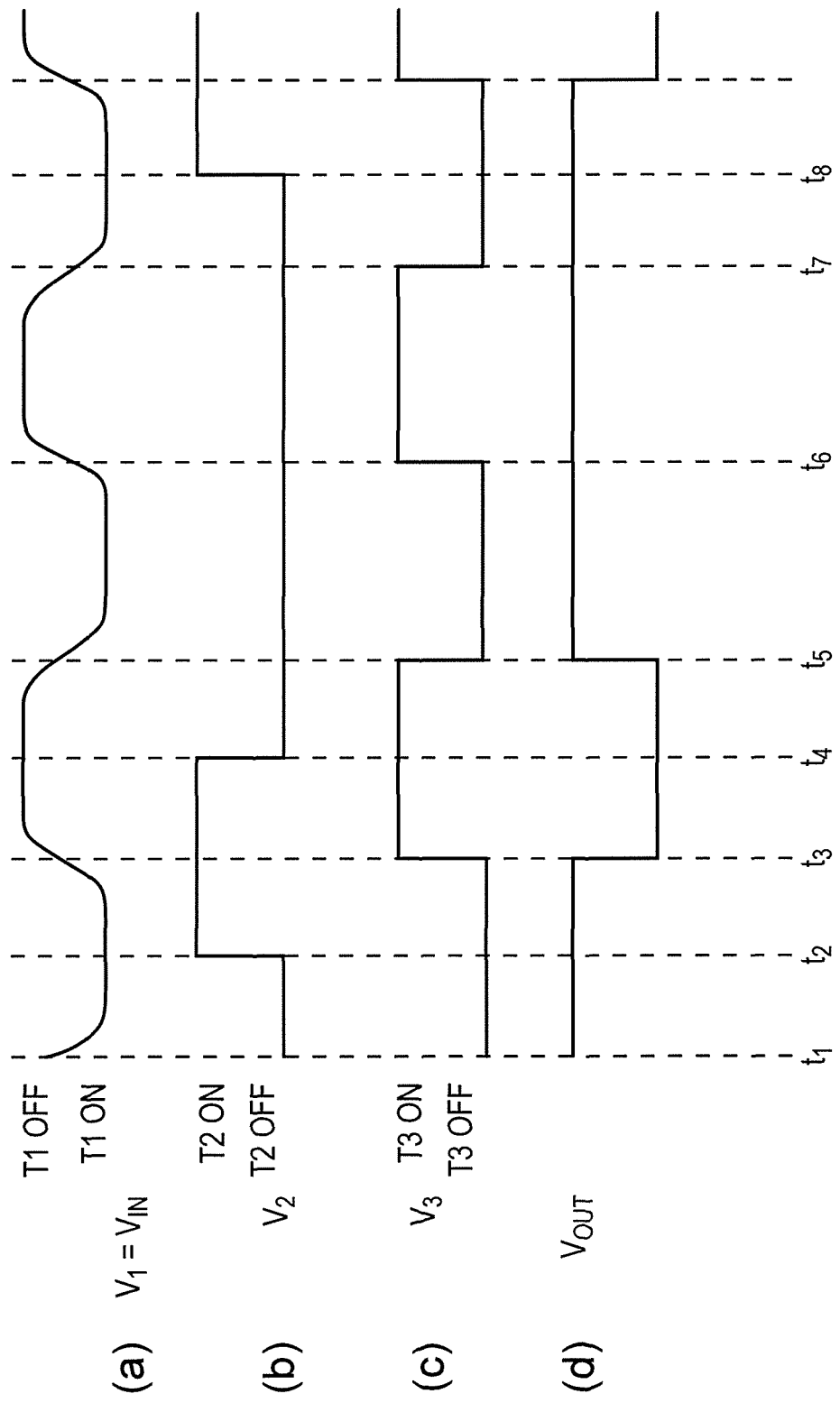
FIG. 7 illustrates signal waveforms relating to the second embodiment of a switching circuit.

Referring to FIG. 7, the input signal $V_{IN}$, shown at waveform a), and which is equal to the first control signal $V_1$, has pulses with a 50% duty cycle and is illustrated with finite rise and fall times. Pulse shapes other than that illustrated in FIG. 7 waveform (a) may alternatively be used for the input signal $V_{IN}$, for example sinusoidal pulses. Disregarding the finite rise and fall times, the first control signal $V_1$ has a relatively high voltage level, being above its mean value, during time periods $t_3$ to $t_5$, and $t_6$ to $t_7$, and a relatively low voltage level, being below its mean value, during the time periods $t_1$ to $t_3$, and $t_5$ to $t_6$. When the first control signal $V_1$ has the relatively high voltage level, the first PMOS transistor T1 is switched off, and when the first control signal $V_1$ has the relatively low voltage level, the first PMOS transistor T1 is switched on, as indicated beside waveform a).

The second control signal $V_2$, which is generated by the division stage 148, is illustrated in waveform b), and in this example corresponds to the input signal $V_{IN}$ divided by two, but having instantaneous rise and fall times, although other rise and fall times may alternatively be used. When the second control signal $V_2$ has the relatively high voltage level, the second NMOS transistor T2 is switched on, and when the second control signal $V_2$ has the relatively low voltage level, the second NMOS transistor T2 is switched off, as indicated beside waveform b). The pulses of the second control signal $V_2$ are delayed, with respect to the pulses of the input signal $V_{IN}$ from which they are generated, by the division stage 148 so that the second NMOS transistor T2 changes from the non-conducting state to the conducting state while the first PMOS transistor T1 is in the conducting state, and changes from the conducting state to the non-conducting state while the first PMOS transistor T1 is in its next non-conducting state.

The switching of the complementary NMOS transistor T3 is opposite to, that is, complementary to, the switching of the first PMOS transistor T1. Therefore, the complementary NMOS transistor T3 switches on whenever the first PMOS transistor T1 switches off, and switches off whenever the first PMOS transistor T1 switches on, as illustrated in waveform c) of FIG. 7.

During the period $t_1$ to $t_2$, the first PMOS transistor T1 is switched on, that is, is in a conducting state, and the second NMOS transistor T2 and is switched off, that is, is in a non-conducting state. Therefore, therefore the voltage of the output signal $V_{OUT}$ at the output node 120 is at a relatively high level, as illustrated in waveform d). The waveforms in FIG. 7 b), c) and d) are illustrated with instantaneous transitions, but in practice can have finite rise and fall times, particularly in high frequency applications.

At time $t_2$, a leading edge of a positive-going pulse of the second control signal $V_2$ causes the second NMOS transistor T2 to switch on. At this time the complementary NMOS transistor T3 is already switched off, and therefore the voltage of the output signal $V_{OUT}$ at the output node 120 remains at the high level, and current cannot flow from the first voltage rail 110 to the second voltage rail 130.

At time $t_3$, the first control signal $V_1$ causes the first PMOS transistor T1 to switch off and the complementary NMOS transistor T3 to switch on, and therefore the voltage of the output signal $V_{OUT}$ at the output node 120 falls to a relatively low level. Due to finite rise and fall times at time $t_3$, there may be a brief period during which all three of the transistors are on, in which case current can flow from the first voltage rail 110 to the second voltage rail 130.

At time $t_4$, the second NMOS transistor T2 switches off. This has no impact on the output node 120 because the first PMOS transistor T1 is already switched off, and consequently, the output node 120 becomes isolated from the first and second voltage rails 110, 130, in a high impedance state, and so the output signal $V_{OUT}$ floats, remaining at the low level. During the period $t_4$, to $t_5$, both the first PMOS transistor T1 and the second NMOS transistor T2 are switched off.

At time $t_5$, the first PMOS transistor T1 switches on and the complementary NMOS transistor switches off, causing the voltage of the output signal $V_{OUT}$ at the output node 120 to rise to the high level.

At time $t_6$, the first PMOS transistor T1 switches off and the complementary NMOS transistor switches on, whilst the second NMOS transistor T2 remains off. Consequently, the output node 120 again becomes isolated from the first and second voltage rails 110, 130, in a high impedance state, and so the output signal $V_{OUT}$ floats, remaining at the high level. At time $t_7$, the first PMOS transistor T1 switches on and the complementary NMOS transistor switches off, whilst the second NMOS transistor T2 remains off. Consequently, the output node 120 is again driven at the high level, although it is already at the high level. At time $t_8$, second NMOS transistor T2 is switched on, as at time $t_2$, and the events from time $t_2$ are repeated.

The output signal $V_{OUT}$ has the same period and frequency as the second control signal $V_2$, which is equal to the divided input signal $V_{IN}$, but an inverted pulse waveform, as illustrated in waveform d) of FIG. 7. The duty cycle of the output signal $V_{OUT}$ is determined by the duty cycle of the input signal $V_{IN}$ and by the division ratio of the division stage 148. In particular, the duration of the negative-going pulses of the output signal $V_{OUT}$ is equal to the duration of the positive-going pulses of the input signal $V_{IN}$. Therefore, for the example illustrated in FIG. 7, the input signal $V_{IN}$ has a 50% duty cycle, and with division by two in the division stage 148, the duty cycle of the output signal $V_{OUT}$ is 25%. In effect, each positive-going pulse of the second control signal $V_2$ serves to select a positive-going edge of the input signal $V_{IN}$, which determines the time of the leading edge of each negative-going pulse of the output signal $V_{OUT}$, and the time of the trailing edge of each negative-going pulse of the output signal $V_{OUT}$ is determined by the next falling edge of the input signal $V_{IN}$. In this way, the output signal $V_{OUT}$ comprises inverted pulses of the input signal $V_{IN}$ selected by the second control signal $V_2$. As the second control signal $V_2$ merely selects a pulse of the input signal $V_{IN}$, but does not determine the time of the rising and falling edges of the output signal $V_{OUT}$, these being determined by the input signal $V_{IN}$, the output signal $V_{OUT}$ can have a noise performance the same as, or similar to, the noise performance of the input signal $V_{IN}$, and the second control signal $V_2$ provided by the division stage 148 can have a relatively poor noise performance. Consequently, the division stage 148 can be implemented as a low current, low power device. The output signal $V_{OUT}$ can have a different duty cycle by employing a different division ratio in the division stage 148. For example, a division ratio of four can be used to provide the output signal $V_{OUT}$ with a duty cycle of 12.5%.

Although embodiments have been described which employ PMOS and NMOS transistor, other type of switching devices, and in particular other types of semiconductor devices, may alternatively be employed. The switching circuit 100, 200 may be implemented in the respective integrated circuits 180, 190 using an MOS or other integrated circuit manufacturing process.

The first and second control signals $V_1$, $V_2$ are not limited to the waveforms illustrated, and other waveforms may alternatively be used, in particular for providing the output signal $V_{OUT}$ with other waveforms, such as a different duty cycle or a different pulse polarity.

Although the switching circuits 100, 200 employ additional elements, in comparison to the prior art example illustrated in FIG. 1, in particular the controller 140, these additional elements can operate with a low power consumption, and the additional power consumed by the additional elements can be more than offset by the power saving due to the reduction in current flowing from the first voltage rail 110 to the second voltage rail 130 through the first PMOS transistor T1 and the second NMOS transistor T2, especially in applications where the switching circuit 100, 200 is employed as a driver device.

The embodiment described with reference to FIG. 6 may alternatively be regarded as a divider comprising: a division element 148 for dividing an input signal $V_{IN}$ to provide a divided input signal; a first switch element T1 coupled between a first supply node 110 and an output node 120, the first supply node 110 being at a first supply voltage $V_{DD}$; and a second switch element T2 coupled between a second supply node 130 and the output node 120, the second supply node 130 being at a second supply voltage $V_{SS}$; wherein the divider is arranged to switch between a first state, in which the first switch element T1 is in a conducting state and the second switch element T2 is in a non-conducting state, and a second state, in which the first switch element T1 is in a non-conducting state and the second switch element T2 is in a conducting state, through an intermediate state in which both the first switch element T1 and the second switch element T2 are in the non-conducting state by controlling the first switch element T1 in response to the input signal $V_{IN}$ and controlling the second switch element T2 in response to the divided input signal.

Figure 8:
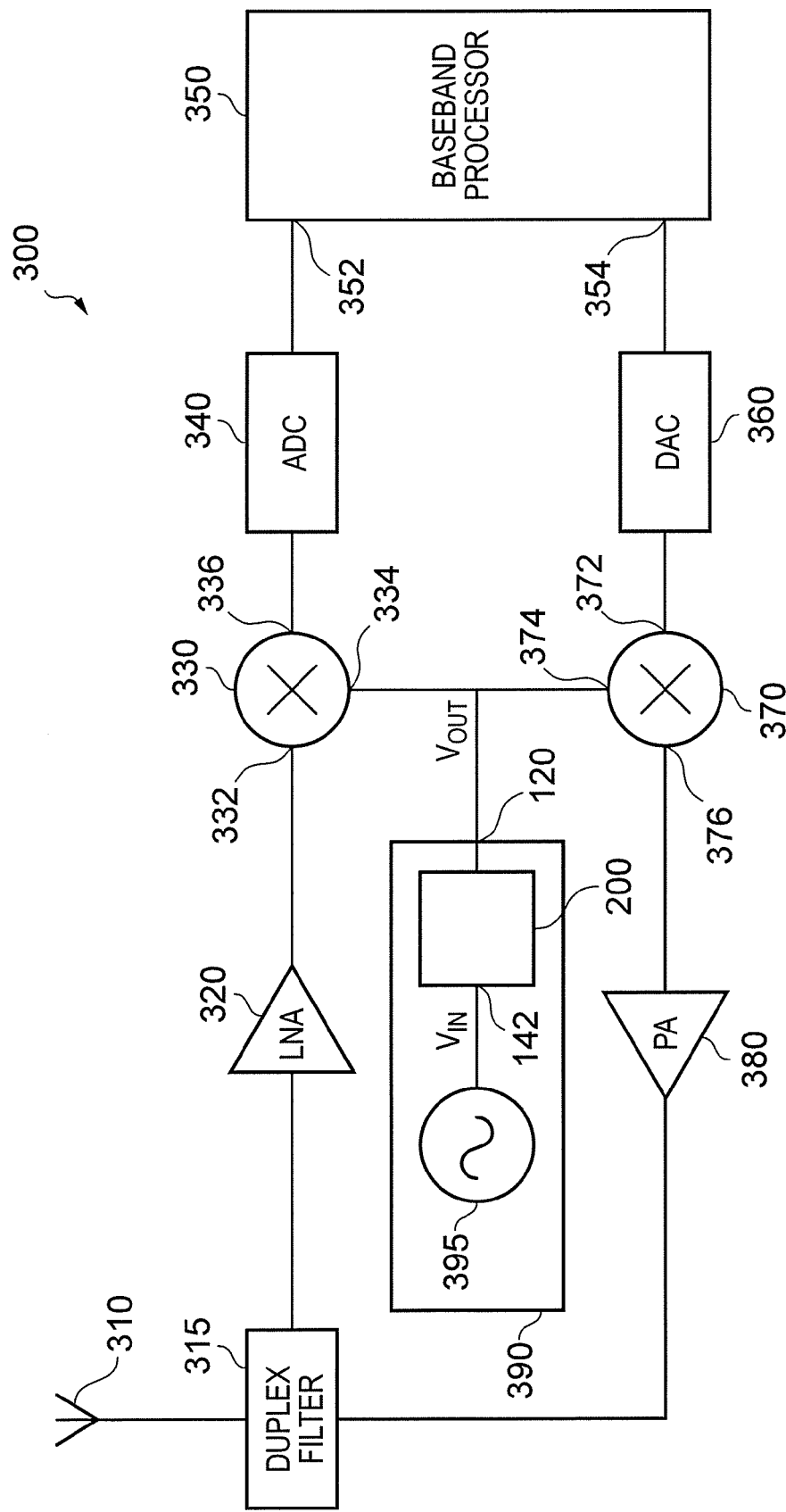
FIG. 8 is a block schematic diagram of a wireless communication device.

Referring to FIG. 8, a wireless communication device, for example a mobile phone, comprises an antenna 310 coupled to a first port of a duplex filter 315. An output port of the duplex filter 315 is coupled to an input of a low noise amplifier (LNA) 320. An output of the LNA 320 is coupled to a first input 332 of a down-conversion mixer 330. A second input 334 of the down-conversion mixer 330 is coupled to a local oscillator circuit 390 which provides a local oscillator signal. The local oscillator circuit 390 comprises a reference oscillator 395 coupled to the switching circuit 200 described with reference to FIG. 6. The reference oscillator 395 generates the input signal $V_{IN}$ which is provided to the input 142 of the switching circuit 200, and the switching circuit 200 delivers at its output node 120 the output signal $V_{OUT}$. The output node 120 of the switching circuit 200 is coupled to the second input 334 of the down-conversion mixer 330. The down-conversion mixer 330 uses the output signal $V_{OUT}$ as the local oscillator signal for down-converting a signal received at the antenna 310 and delivered to the first input 332 of the down-conversion mixer 330. The down-converted signal is delivered to an input 352 of a baseband processor 350 by means of an analogue-to-digital converter 340. A signal for transmission from the antenna 310 is provided at an output 354 of the baseband processor 350 which is coupled to a first input of an up-conversion mixer 372. A second input of the up-conversion mixer 372 is coupled to the output node 120 of the switching circuit 200 for receiving the output signal $V_{OUT}$ which the up-conversion mixer 372 uses as a local oscillator signal for up-converting the signal for transmission. The up-converted signal is delivered at an output 376 of the up-conversion mixer 372 which is coupled to an input port of the duplex filter 315, and therefore to the antenna 310, by means of a power amplifier (PA) 380.

Other variations and modifications will be apparent to the skilled person. Such variations and modifications may involve equivalent and other features which are already known and which may be used instead of, or in addition to, features described herein. Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that the Figures are not necessarily to scale; emphasis instead generally being placed upon illustrating the principles of the present invention.

The invention claimed is:

1. A switching circuit for switching a voltage at an output node, the circuit comprising:
   a first switch element coupled between a first supply node and the output node, the first supply node being at a first supply voltage;

a second switch element coupled between a second supply node and the output node, the second supply node being at a second supply voltage;

a controller configured to switch, depending on an input signal, the first and the second switch element between a first state and a second state through an intermediate state, wherein in the first state the first switch element is in a conducting state and the second switch element is in a non-conducting state, and in the second state the first switch element is in a non-conducting state and the second switch element is in a conducting state, and in the intermediate state both the first switch element and the second switch element are in the non-conducting state;

generate a first pulse in response to a falling edge of the input signal and a second pulse in response to a rising edge of the input signal; and control, by a delay element of the controller, a duration of the first and second pulses by triggering trailing edges of the first and second pulses such that a transition in an output voltage of the output node is preceded by the intermediate state, wherein the first switch element is configured to switch to the conducting state in response to a leading edge of the first pulse and to the non-conducting state in response to the trailing edge of the first pulse, and wherein the second switch element is configured to switch to the conducting state in response to a leading edge of the second pulse and to the non-conducting state in response to the trailing edge of the second pulse.

2. The switching circuit as claimed in claim 1, wherein the first switch element comprises a first transistor and the second switch element comprises a second transistor.

3. The switching circuit as claimed in claim 2, wherein the first transistor is a first p-type metal oxide silicon, PMOS, transistor, the second transistor is a second n-type metal oxide silicon, NMOS, transistor and the first supply voltage exceeds the second supply voltage.

4. The switching circuit as claimed in claim 3, the circuit further comprising a complementary NMOS transistor coupled in series with the second NMOS transistor between the second NMOS transistor and the output node, wherein a gate of the first PMOS transistor and a gate of the complementary NMOS transistor are coupled together.

5. An integrated circuit comprising a switching circuit as claimed in claim 1.

6. A local oscillator circuit for a wireless communication device, comprising a switching circuit as claimed in claim 1.

7. A wireless communication device comprising a local oscillator circuit as claimed in claim 6.

8. A method of operating a switching circuit having a first switch element coupled between a first supply node and an output node, the first supply node being at a first supply voltage, and a second switch element coupled between a second supply node and the output node, the second supply node being at a second supply voltage, the method comprising:

dependent on an input signal, switching the switching circuit between a first state and a second state through an intermediate state, wherein in the first state the first switch element is in a conducting state and the second switch element is in a non-conducting state, in the second state the first switch element is in a non-conducting state and the second switch element is in a conducting state, and in the intermediate state both the first switch element and the second switch element are in the non-conducting state;

generating a first pulse in response to a falling edge of the input signal and a second pulse in response to a rising edge of the input signal;

switching the first switch element to the conducting state in response to a leading edge of the first pulse and to the non-conducting state in response to a trailing edge of the first pulse;

switching the second switch element to the conducting state in response to a leading edge of the second pulse and to the non-conducting state in response to a trailing edge of the second pulse; and controlling a duration of the first and second pulses by triggering the trailing edges of the first and second pulses so that a transition in an output signal of the output node is preceded by the intermediate state.

* * * * *